United States Patent [19]

Bujese et al.

[11] Patent Number: 4,793,255
[45] Date of Patent: Dec. 27, 1988

[54] ELECTROSTATIC PICK-UP ONTO AND RETENTION OF PERMANENT MASTER ON A FLEXIBLE WEB

[75] Inventors: David P. Bujese, Butler; Robert H. Detig, Berkeley Heights, both of N.J.

[73] Assignee: Olin Hunt Specialty Products, Inc., Palisades Park, N.J.

[21] Appl. No.: 173,571

[22] Filed: Mar. 25, 1988

[51] Int. Cl.$^4$ .............................................. B41F 1/30
[52] U.S. Cl. .................................. 101/426; 101/131.5; 101/409; 355/3 TR; 355/77; 430/33
[58] Field of Search ............... 101/426, DIG. 13, 131, 101/131.5, 407 BP, 409; 355/3 TR, 3 TE, 77; 430/31, 33, 35, 48, 49

[56] References Cited

U.S. PATENT DOCUMENTS

| | | | |
|---|---|---|---|
| 339,166 | 4/1886 | Griffith | 101/131.5 |
| 2,602,395 | 7/1952 | Davis | 101/131 |
| 3,861,306 | 1/1975 | DuBois et al. | 101/132.5 |
| 3,957,220 | 5/1976 | Beck et al. | 242/67 |
| 4,002,475 | 1/1977 | Ott et al. | 430/35 |
| 4,008,660 | 2/1977 | Hooper et al. | 101/132 |
| 4,264,201 | 4/1981 | Stahl | 355/77 |
| 4,362,378 | 12/1982 | Erskine et al. | 355/3 TR |

Primary Examiner—Eugene H. Eickholt
Attorney, Agent, or Firm—Ralph D'Alessandro

[57] ABSTRACT

Apparatus and a method of using that apparatus to electrostatically pickup and retain a master onto a dielectric substrate is provided. The dielectric substrate can be a flexible web with a conductive coating applied to one surface on which the master is retained. The master has an exposed permanent latent image therein.

41 Claims, 4 Drawing Sheets

ELECTROSTATIC PICK-UP ONTO AND RETENTION OF PERMANENT MASTER ON A FLEXIBLE WEB

BACKGROUND OF THE INVENTION

This invention relates generally to the apparatus used to electrostatically retain an exposed photopolymer material on a conductive substrate and the method by which such master is picked up and retained. More specifically, it pertains to the use of a flexible web to electrostatically pick-up onto and retain an exposed permanent master on the conductive area of the web during the production of multiple copies.

The permanent master and the flexible web are used as part of a system to repeatedly produce high resolution and high quality images on receiving surfaces. These receiving surfaces can be conductive, such as printed circuit boards, or nonconductive, such as paper or plastic which may be used in color graphic applications.

Conductive receiving surfaces, such as printed circuit boards, have traditionally been produced by individual laminating, exposing, developing, etching and stripping processes where dry film photoresist has been used to produce the conductive wiring patterns. Heretofore, there has been no method or apparatus available to produce a plurality of copies of conductive wiring patterns from a single master copy of the desired wiring pattern utilizing a dry film resist and photo-imaging. There are many factors which have prevented this type of a system from being employed to manufacture multiple copies from a single master.

Similarly, the use of a single master employing a dry film photoresist in conjunction with nonconductive receiving surfaces, such as those used in color graphics, has heretofore not been possible.

The ability to precisely position the master onto a supporting surface and accurately and repeatedly position it on the receiving surface to obtain the necessary tolerances and repeated copies has been a continuing problem. Similarly, the simple attachment of the master to that supporting surface in a manner that does not damage the master has also been a problem.

These problems are solved in the design of the present invention which utilizes a flexible web to electrostatically pick up an exposed master with a permanent latent image thereon for the repeated printing of toner developed copies on receiving surfaces.

SUMMARY OF THE INVENTION

It is an object of the present invention to provide a flexible carrier web that is tensioned and which will electrostatically pick-up and retain a master for use in the repeated printing of copies onto receiving surfaces.

It is another object of the present invention to provide for the electrostatic pick-up of the exposed master, with a permanent latent image therein, onto a flexible carrier web in a manner that automatically attaches the master to the web and registers the master both to the web and to the supporting surface which holds or supports the receiving surfaces onto which the toner developed image is transferred.

It is also another object of the present invention to provide a method of retaining the exposed master with the permanent latent image therein on the web in a manner that does not damage the master.

It is a feature of the present invention that the supporting or carrier web is flexible, but is held in tension and stretched taut.

It is another feature of the present invention that the flexible carrier web has a ground area adjacent a ground roller and a high voltage or conductive area adjacent a tensioning roller which is connected to a source of high voltage.

It is still another feature of the present invention that the conductive high voltage portion of the flexible carrier web is isolated from ground by a nonconductive border surrounding the web.

It is yet another feature of the present invention to provide a means by which charged developing toner particles are prevented from building up on the conductive surface of the flexible carrier web by applying to the flexible carrier web an electrical charge of the same polarity as is carried by the charged toner particles to repel the particles and prevent the buildup of toner particles on the portion of the web not covered by the master.

It is an advantage of the present invention that the master can be both easily attached to and easily detached from the flexible carrier web.

It is another advantage of the present invention that the flexible carrier web is subject to the high tensioning forces as it is held in position, but the flexible thin master which is electrostatically attached thereto is not subject to the same forces.

These and other objects, features and advantages are obtained by the use of a flexible carrier web to electrostatically pick-up a master onto a surface of the web and retain the master thereon during the repeated printing of toner developed copies from the master. The flexible carrier web is held in tension between a tension roller that is connected to a source of high voltage and a retention roller that is electrically grounded. The area adjacent the grounded retention roller is electrically isolated from the high voltage conductive portion of the flexible carrier web.

BRIEF DESCRIPTION OF THE DRAWINGS

The objects, features and advantages of the present invention will become apparent upon consideration of the following detailed disclosure of the invention, especially when it is taken in conjunction with the accompanying drawings wherein.

DETAILED DESCRIPTION OF THE PREFERRED EMBODIMENT

Figure 1:
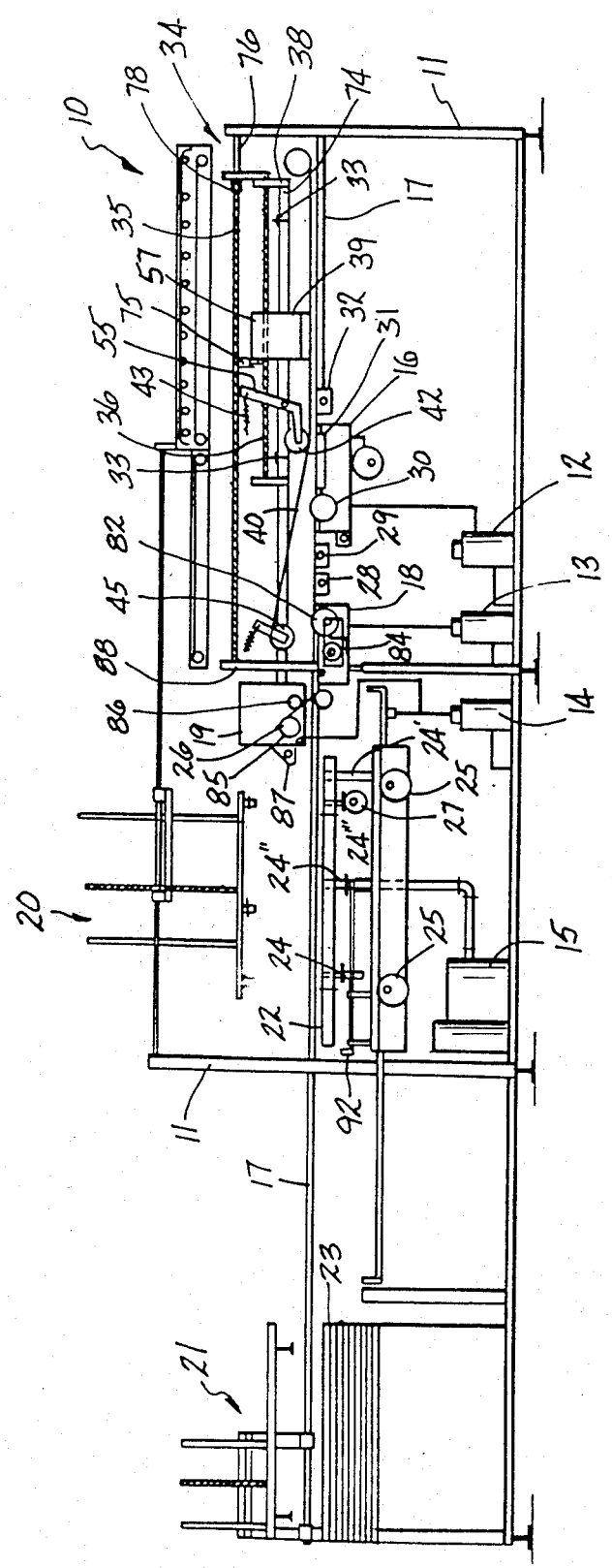
FIG. 1 is a side elevational view of the apparatus used to transfer electrostatically developed images from a master which is electrostatically picked up and retained on the flexible carrier web to a receiving surface.

FIG. 1 shows a side elevational diagrammatic illustration of the electrostatic imaging apparatus, indicated generally by the numeral 10. Apparatus 10 has a support frame 11, to which are mounted toner tank assembly 12, cleaning station tank and feed line assembly 13, non-polar insulating solvent tank assembly 14, and vacuum pump assembly 15. Each of the tank assemblies 12, 13 and 14 have appropriate hoses and pumps to either distribute the toner to the toning or development station 16 or the non-polar insulating solvent to the master cleaning station 18 and wicking station 19, respectively. Apparatus 10 at the infeed end has a board feeder unit 21 which picks up individual receiving surfaces 23, such as copper boards or nonconductive materials depending upon the application, by appropriate means, such as suction or vacuum pickup, and transports it along guide rails 17 to a board receiving station or stationary platen 22, where it is correctly positioned by alignment pins 24. After image transfer to the receiving surface 23 has been completed, a board pickup unit 20 removes the imaged receiving surface 23 from the platen 22 in preparation for receipt of the next receiving surface 23 for imaging.

Figure 5:
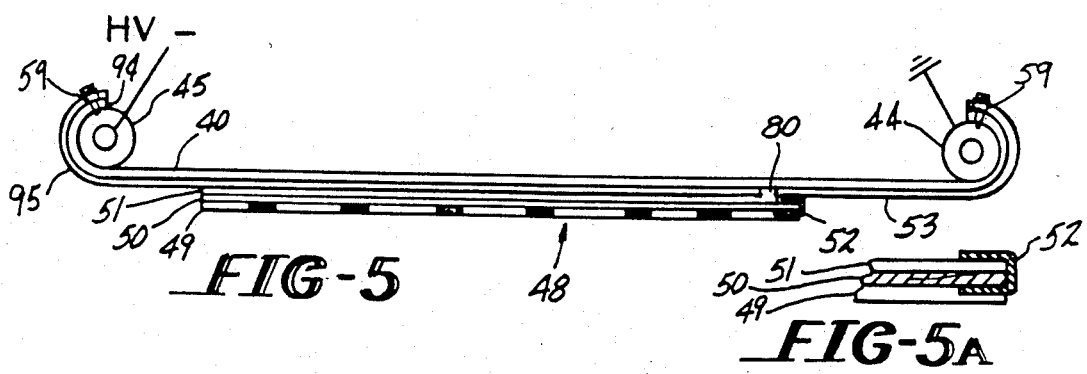
FIG. 5 is a side elevational view of the master electrostatically attached to the flexible carrier web which is stretched taut between the retention roller and the tensioning roller.

A permanent master is used to produce the desired image on each copper board or receiving surface 23. The permanent master, indicated generally by the numeral 48 and best seen in FIG. 5, is a multiple layered structure having a base layer 51 of a suitable flexible and nonconductive plastic, such as a polyethylene terephthalate sold under the trade name Mylar ®, which is coated with an electrically conductive layer 50 and a layer of photopolymer material 49, such as dry film or liquid photoresist. Any appropriate photopolymer may be used as long as it possesses the ability to permanently change its electrical resistively upon exposure to actinic radiation. Suitable conductive materials useable in the conductive layer 50 include aluminum, copper, silver, electrically conductive paints or coatings, or conductive polymers. The permanent master is produced by exposing the desired pattern, such as through a mask, to actinic radiation. The exposed pattern on the electrostatically imageable surface of the master, once thus cross-linked, creates a permanent latent image with permanently increased electrical resistivity. This latent image will hold an electrostatic charge when exposed to a charging apparatus, such as corona 32 of FIG. 1. The charged latent image attracts the toner particles of an appropriate toner when the master 48, with the image thereon, is passed through toning station 16.

Figure 7:
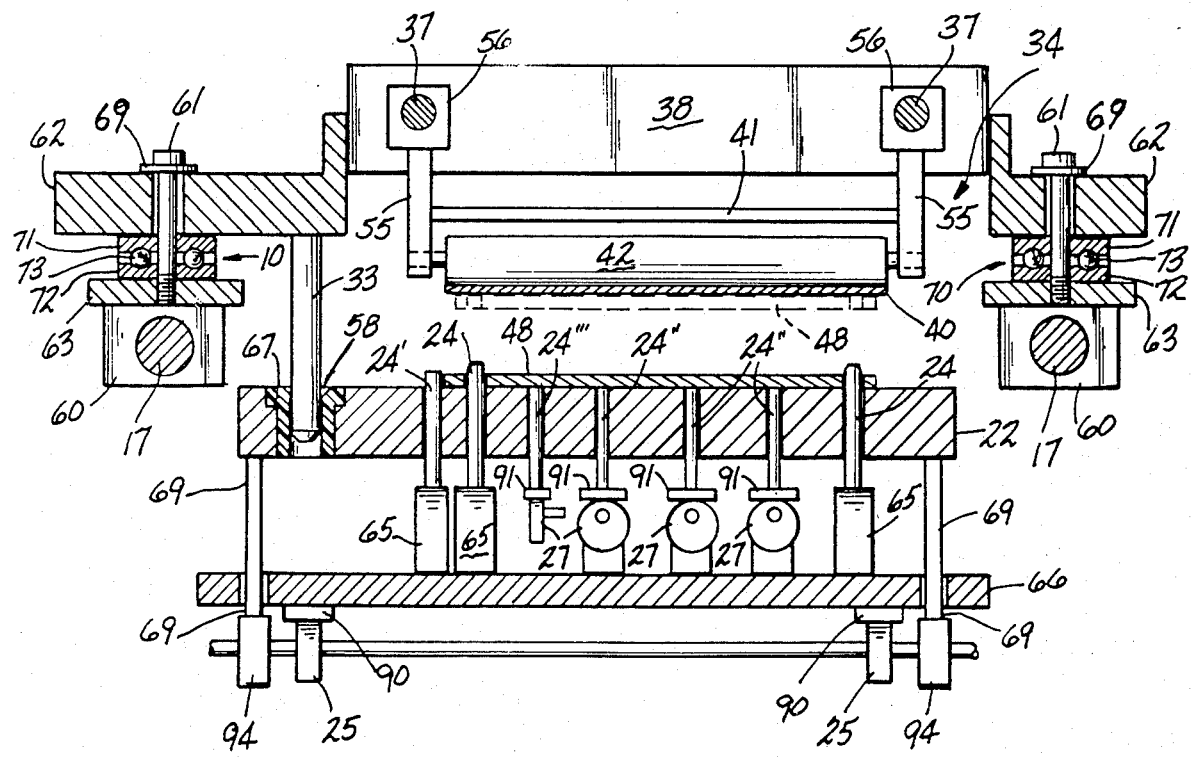
FIG. 7 is an end elevational view of a section of the apparatus of FIG. 1 showing the permanent master in phantom lines picked up and electrostatically retained on the flexible carrier web over the supporting surface or platen and in solid lines showing the master supported by the platen that receives the receiving surfaces to which the toner developed images are transferred after the master is electrostatically picked up.

The master 48 is placed on a stationary platen 22 of FIGS. 1 and 7 with the photopolymer surface layer 49 down prior to the picking up of any of the conductive receiving surfaces 23. Previously an alignment template (not shown) has been used to adjust all of the alignment pins 24, 24', 24", and 24''' to fit within the holes in the heavy metal template that is placed over the raised pins on the platen 22. The position of alignment pins 24, 24', 24", and 24''' may be adjusted by means of adjustment screws (not shown) beneath platen 22. Once proper adjustment has been achieved, the template is removed and the master registration process begins.

Figure 8:
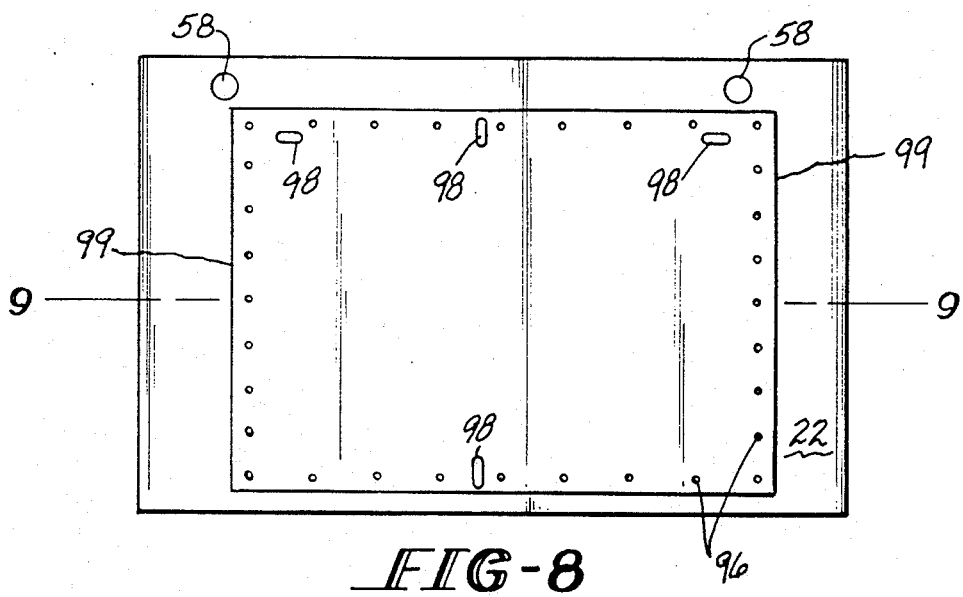
FIG. 8 is a top plan view of the supporting surface or platen that supports the dummy receiving surface and the permanent master showing the perimeter vacuum holes and alignment pin holes in the dummy receiving surface that are used to properly position and retain the permanent master on the platen until it is electrostatically picked up onto the flexible carrier web.
Figure 9:
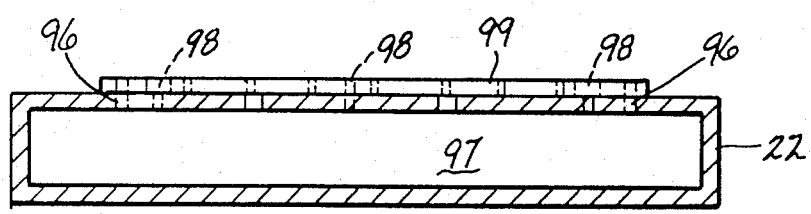
FIG. 9 is a sectional view taken along the lines 9—9 of FIG. 8 of the platen with the dummy receiving surface positioned thereon showing the hollow vacuum chamber.

First a dummy receiving surface 99 or punch guide or FIGS. 8 and 9 is placed on the platen 22. This dummy receiving surface 99 is of the same thickness as the receiving surfaces 23 which will be employed during the actual image transfer process. The dummy receiving surface 99 has a plurality of vacuum holes 96 only about its perimeter that correspond to holes in the platen 22 so that the master 48 tacked in place about its perimeter and is not damaged by being drawn down onto the dummy receiving surface in its center. This also ensures that the master 48 is not held so tightly that the electrostatic force cannot overcome the vacuum force drawing down on the master.

The permanent master 48 has previously had its photosensitive surface exposed to obtain the difference in electrical resistivity required for the process by the cross-linking of the exposed surface area to obtain the permanent latent image desired. This cross-linked exposed surface area has increased electrical resistivity.

Alignment pins 24 of FIG. 8 are then raised in the registration process to register the master 48 and the dummy receiving surface 99 to the platen 22. Alignment pins 24 register the master 48 to the platen 22 through an adaptation of the standard four (04) slot system. This adaptation results in a "T" design that utilizes 3 slots 98 in both the dummy receiving surface 99 and the master 48 along one edge and a single slot 98 at the base of the "T" as seen in FIG. 8. The alignment pins 24 of FIG. 7 fit within these slots 98. This permits two sides of a receiving surface 23 to be precisely imaged, such as with dual sided circuit boards, even when two different masters are used and to permit variable width receiving surfaces 23 to be used. This "T" design pin arrangement simplifies the registration system.

As seen in FIG. 7, alignment pins 24, 24' 24" and 24''' comprise four sets which are actuated by cams 25. Alignment pins 24" and 24''' are selected for actuation by cam control rods 92, only one of which is shown in FIG. 1, depending on the size of the surface to be registered. The alignment pins 24 are used to register the 24"×30" long master 48 to the receiving surface. The master 48 is always the same size to ensure that the full width of the carrier web means 40 is covered to prevent the buildup of contaminants between the master 48 and the carrier web means 40. By selection of the appropriate alignment pins 24, 24', 24" and 24"' receiving surfaces of a width of 12 inches, 16 inches, 18 inches or 24 inches, for example, may be selected and registered on the platen 22 for either 18 inch or 24 inch length boards. Alignment pins 24 and 24' are always actuated regardless of the size of the receiving surface.

Once properly registered by having the pins 24 position and retain the master 48 and the dummy receiving surface 99 in position, the vacuum pump apparatus 15 is activated to hold both the dummy receiving surface 99 and the master 48 in place. Perimeter vacuum holes 96 permit the suction to retain the master 48 in its proper position through the dummy receiving surface 99. The outline of the dummy receiving surface 99 that supports the master 48 is shown in FIG. 8. Platen 22 has a plurality of holes (not shown) which permits the vacuum pump assembly 15 to suction out the air from beneath the dummy receiving surface 99 into the platen vacuum chamber 97 of FIG. 9 to hold the dummy receiving surface 99 and the master 48 in place. Alignment pins 24 thus assure that the master 48 is properly positioned on the stationary platen 22 via tee use of pin contact plate cams 25, dielectric cam contact blocks 90 and pin contact plate 66, all best seen in FIG. 7, or other appropriate apparatus.

FIG. 7 shows how the pin contact plate 66 is raised by the contact of the pin contact plate cams 25 against cam contact blocks 90. Pin contact plate cams 25 are controlled by a 180 degree clutch and are driven by a drive motor and chain sprocket (all not shown). This contact in turn raises alignment pins 24 by the contact of plate 66 with pin receptacles 65. The action of pin cams 27, selected and actuated by the cam control rod 92 (see FIG. 1) is as shown in FIG. 7 wherein eccentric cams 27 raise up against cam blocks 91 to raise the desired one of alignment pins 24", depending upon the width of the receiving surface 23 into an operational mode.

The master 48 is then picked up by the flexible carrier web means 40 by having the master transport assembly, indicated generally by the numeral 34 in FIGS. 1 and 7, move over the platen 22. Master transport assembly 34 is driven along guide rails 17 by the main drive screw shaft 35 of FIG. 1. The master transport assembly 34 is aligned and registered to the master 48 and platen 22 by the engagement of alignment pins 33 (see FIGS. 1 & 7) on the transport assembly 34 with the pin receptacles 58 (only one of which is shown in FIG. 7), as will be explained in greater detail hereafter. Alignment pins 33 are raised or lowered by air cylinders (not shown). As seen in FIG. 7, transport assembly 34 travels along guide rails 17 via transport assembly bearings 60. Bearings 60 are connected by support brackets 62 and an appropriate fastener 61, such as a bolt or pin, to transport assembly support members 63.

Master transport assembly alignment pins 33 register the transport assembly 34, with its flexible web 40, to the platen 22 so there is no play through the use of thrust bearings, indicated generally by the numeral 70, seen in FIG. 7, connecting the transport assembly support member or rail 63 and the transport assembly support brackets 62, which are appropriately fastened to transport assembly carriage rail 74 of FIG. 1. Thrust bearings 70 comprise a top floating washer 71, a bottom stationary washer 72 and ball bearings 73. A top washer 69 fits about the fastener 61.

Alignment pins 33 then drop down into the pin receptacles 58 in the platen 22 when the transport assembly 34 with the carrier web 40 is properly positioned over the platen 22. Receptacles 58, only one of which is shown in FIG. 7, have their upper sides tapered to permit the pins to compensate for any slight misalignment. A direct voltage is applied to the carrier web 40 through the web retention roller 44 or the web tensioning roller 45. Which ever roller does not have the voltage source attached thereto serves as the ground roller.

Figure 2:
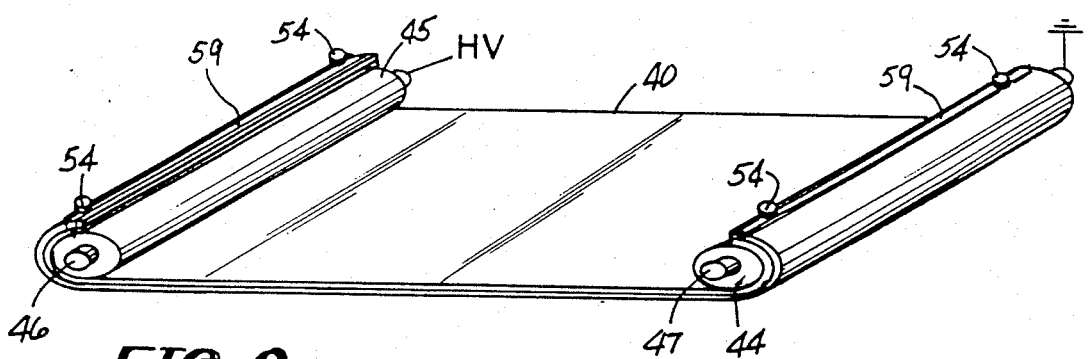
FIG. 2 is a diagrammatical illustration of the flexible carrier web secured by and stretched taut between a tensioning roller and a retention roller.
Figure 10:
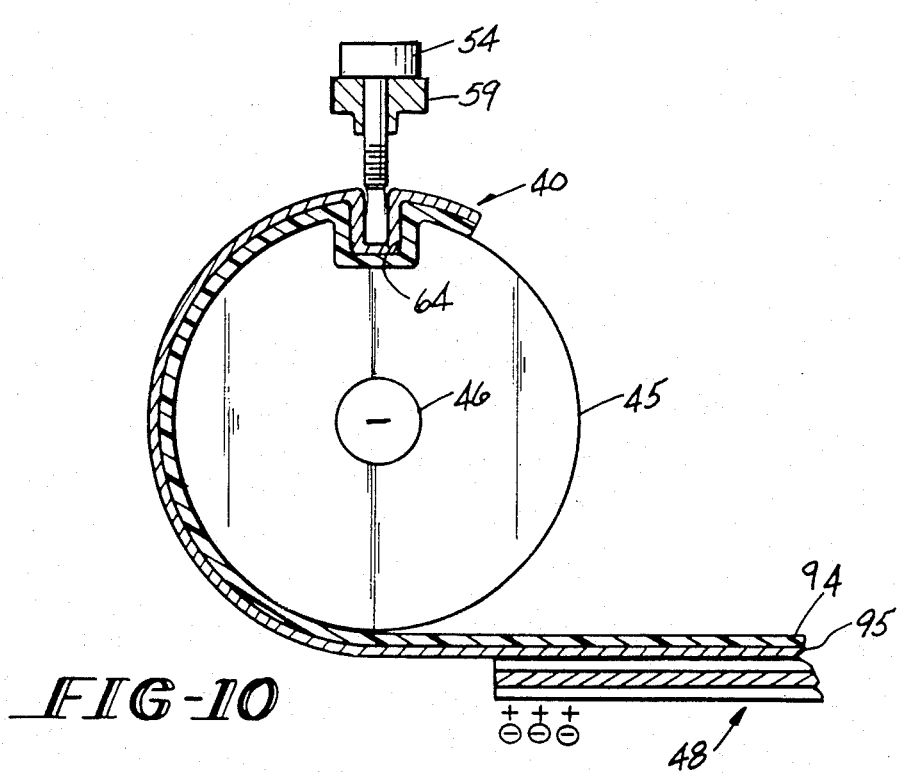
FIG. 10 is an enlarged side elevational view showing a portion of the flexible carrier web as it is fastened to the tensioning roller via a web clamping bar and a portion of the permanent master electrostatically held in place on the flexible carrier web.

The electrical charge is supplied to the carrier web means 40, formed from a flexible, dielectric material layer 94 having a conductive coating 95 on the side in contact with the master 48 and best seen in FIGS. 2 and 10. Silver coated polyethylene terephthalate, sold under the tradename Mylar ® plastic, has been successfully employed as the carrier web means 40. Other materials used to form the dielectric material layer 94 include polyvinyl fluoride, polyvinylidene fluoride, polyimide and polycarbonate. Other similar materials are suitable, as long as they possess the key properties of both temperature and humidity dimensional stability, resistance to handling deformation, high voltage breakdown strength, good surface voltage creep resistance and degradation resistance due to hydrocarbon exposure. Suitable conductive coatings also include aluminum, copper, electrically conductive paints or coatings, and electrically conductive polymers.

Figure 3:
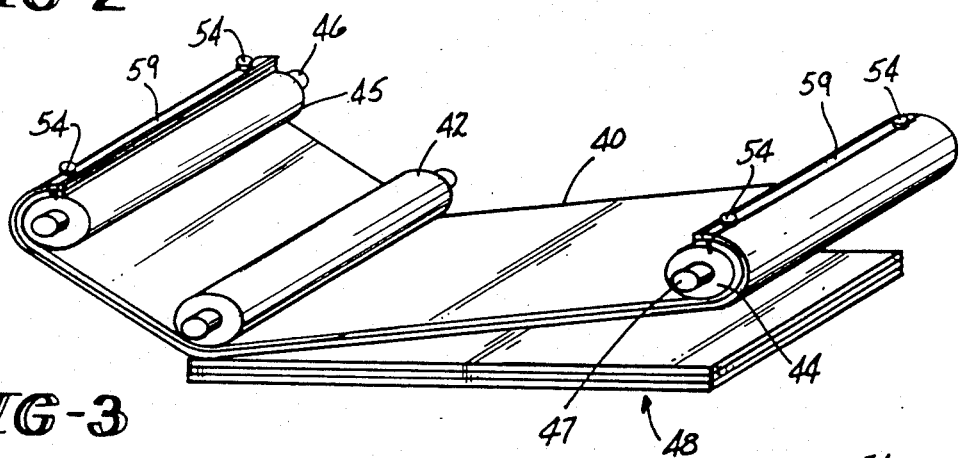
FIG. 3 is a diagrammatical illustration of the flexible carrier web initially electrostatically picking up the permanent master by the traversal of a transfer roller across the top surface of the carrier web.
Figure 4:
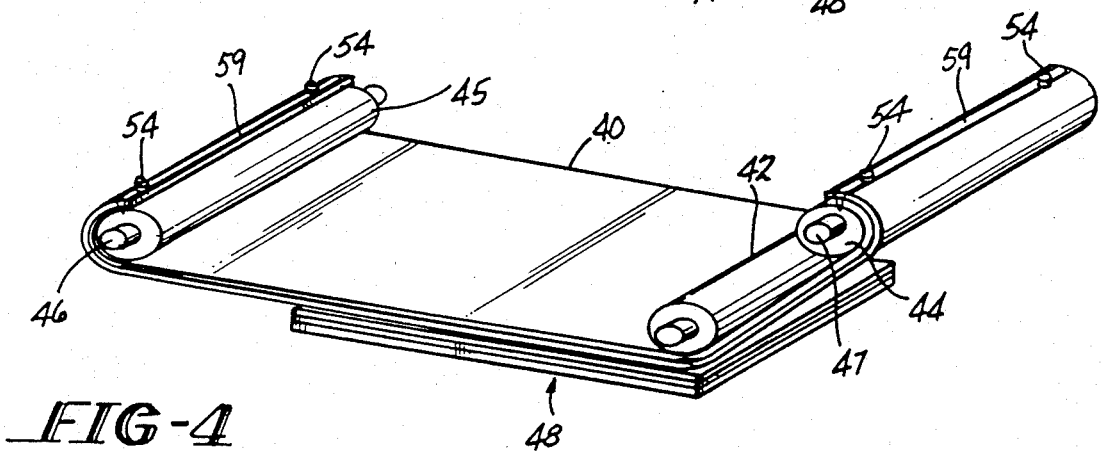
FIG. 4 is a diagrammatical illustration of the completion of the electrostatic pick-up of the permanent master onto the flexible carrier web as the transfer roller completes its traversal across the carrier web.

The electrical charge supplied to the carrier web means 40 is transmitted via the tensioning roller shaft 46, the tensioning roller 45, the web retention screws 54 and the web retention clamp 59 to the conductive coating layer 95. This voltage then creates the electrostatic force which is sufficient to overcome the slight vacuum created by the perimeter vacuum holes 96 in the platen 22 to pick up and hold the master 48 on the carrier web means 40. The master 48 is picked up by the carrier web means 40 when the web means 40 is brought into contact with master 48 at discrete points as the transfer roller 42 traverses along the top surface of the carrier web means 40, as best seen in FIGS. 3 and 4. This contact with the master 48 can start a short distance to the interior of the edge of the master 48 so that the traversal covers slightly less than the entire length of the master 48. After the transfer roller 42 has completed its traverse, the master transport assembly 34, with the master 48 held in place on the carrier web means 40 as seen in FIG. 5, then returns to the start position shown in FIG. 1.

Since the master transport assembly 34 was registered to the platen 22 via the alignment pins 33 and the master 48 was registered to the platen 22 via the pins 24, the master 48 is now registered to the master transport assembly 34 and its carrier web 40. The dummy receiving surface 99 is then removed from the platen 22 and the board feeder unit 21 is activated to feed a receiving surface 23 onto the platen 22.

Receiving surface 23 is then registered to the platen 22 via the pins 24, 24' and, dependent upon the size of the receiving surface 23, pins 24" or 24"' in the same manner as the master 48 was registered, but without the use of the dummy receiving surface 99. This is accomplished by the outer perimeter alignment pins 24' of platen 22, only one of which is shown in FIG. 7, raising up to form a right angled corner. During this positioning, the vacuum pump assembly 15 is not activated to permit the receiving surface 23 to be properly positioned. Once properly positioned in the right angled corner, the desired center alignment pins 24" raise up approximately ¼" and the perimeter pins 24' or 24'" raise up approximately another ¼". The vacuum pump assembly 15 is activated and the receiving surface 23 is pulled down onto the platen 22. Alignment pins 24' and, if utilized, pins 24" and 24'" then retract. The receiving surface 23 is then in position for the master transport assembly 34 to bring the charged and toned master 48 over the receiving surface 23. The master transport assembly 34, with its carrier web means 40, is then properly registered again to the platen 22 by the use of master transport assembly alignment pins 33, in the manner as previously described with respect to the registration of the master 48.

A receiving surface 23, such as a copper circuit board that is preferably two-sided, is placed on the platen 22 of FIG. 1 and is registered so it will be precisely aligned with the master 48 by the alignment pins 24 of FIG. 7 that are positioned by means of cams 25, or other appropriate apparatus. The alignment pin receptacles 58, seen in FIG. 7, are electrically isolated from the platen 22 by a dielectrically insulating sleeve 67 surrounding the receptacles 58 to isolate the high voltage charge on the platen 22 from the master transport assembly 34. This high voltage charge is used to electrostatically transfer the developed image from the master 48 to the receiving surface 23, in conjunction with the transfer roller 42. Dielectric standoffs 69, dielectrically insulating sleeves 67 and dielectric cam contact blocks 90, made of an insulating plastic, are used to electrically isolate platen 22 from the support frame 11.

The master transport assembly 34, once the receiving surface 23 is properly positioned on platen 22, carries the carrier web means 40 and the master 48 of FIG. 2 toward the platen 22. The master 48, passes over the charging corona 32 of FIG. 1, which charges the permanent latent image on the master 48, and then passes over the development or toning station 16, which includes reversing roller 30 and development toner electrode 31, to develop the latent image. Toner is fed out of the slots (not shown) in the electrode 31 at an angle to ensure the surface of the development electrode 31 is completely coated during development of the master 48. The toner is pumped from the toner tank assembly 12 of FIG. 1. Reversing roller 30, is driven by a pair of reversing roller drive gears (not shown) that are driven by reversing roller drive sprockets (not shown), that are in turn driven by a drive motor and drive chains (not shown). One of the two drive sprockets uses a spur gear (not shown) to drive reversing roller 30.

The carrier web backing means or backing plate (not shown) is held stationary in place over the development station 16 of FIG. 1 as the master transport assembly 34 is driven through the development cycle. Development or toning station 16 is maintained in the raised position during this time by an eccentrically shaped toning station cam (not shown) that is in a raised position so that the cam forces up against a cam receiving plate (not shown). This cam is rotated between its off-centered raised position and its lowered position by a rotational clutch, a drive chain and a cam drive sprocket (all not shown). Once transfer roller 42 has passed over development electrode 31, depressant corona 29, and the discharge corona 28, bearing stop block 57 strikes a pneumatically driven pin 75 that is mounted to support rail 76. At this time the transfer roller 42 separates from the web backing plate.

The separation is effected by the master transport assembly 34 being driven by the master transport assembly drive motor 78 and its associated main drive screw shaft 35 until the stop block 57, with its bearing 39, contact retractable pin 75, which is mounted to an angle iron support rail 76. Transfer roller bearings (not shown) are driven by transfer roller drive screw rod 36 via a drive screw and an associated transfer roller drive bracket (both not shown), until the pivot arms 55 are driven with the transfer roller bearings into contact with stop pins (not shown), mounted to brackets (also not shown) fastened to the transport assembly support members 63. This causes the pivot arms 55, spring loaded by the tensioning springs 43, of FIG. 1, to rotate about pins thereby causing the transfer roller 42 to become separated from the web backing plate. After separation, the transfer roller 42 is held in its raised position by being driven against a contact pin (not shown). The entire transfer roller means, including the pivot arms 5, transfer roller 42, stop block 57 and bearing 39, is driven along bearing support shaft 37 of FIG. 7 by transfer roller drive screw rod 36 of FIG. 1.

The engagement of bearing stop block 57 with retractable pin 75, and the subsequent separation of the transfer roller 42 and the web backing plate (not shown), causes the web backing plate to keep the carrier web 40 generally flat and a uniform distance from the toning station 16 during the entire development cycle. During the development cycle, excess solvent is removed from the area around the developed image by the reversing roller 30 of FIG. 1, in conjunction with the depressant corona 29. The excessive non-polar insulating solvent removed from around the developed image before transfer is directed into a collection pipe (not shown), which directs it to a central collection tank (not shown). Upon completion of the development cycle retractable pin 75 is retracted upwardly to allow the web backing plate (not shown) to continue to traverse until it is directly over cleaning station 18.

During this portion of the operation of apparatus 10, the cleaning station 18 of FIG. 1 is in a lowered position so that the cleaning roller 82 does not interfere with the master 48 as it is enroute to the transfer operation. After the image has been transferred to the receiving surface 23, the cleaning station 18 is cammed to a raised position by cam 84, utilizing a rotational clutch (not shown) or other appropriate apparatus.

Prior to the image transfer, wicking station 19 applies a layer of liquid containing non-polar insulating solvent to the receiving surface 23. Gap spacing and charging strips 26 of FIG. 1, preferably about 5 mils thick and formed of Mylar ® plastic film coated with aluminum on the bottom surface, are placed along opposing sides of the receiving surface 23 by dispensing apparatus (not shown) as the master transport assembly 34 passes over the receiving surface 23 on the platen 22. The gap spacing and charging strips 26 maintain the desired distance between the master 48 and the receiving surface 23. As the gap spacing strips 26 are fed out, non-polar insulating solvent is applied to the receiving surface 23 (not shown) by spray bar 86 (not shown), mounted on the wicking station 19. A roller 85 spreads out the solvent to ensure that a uniform layer is applied to the receiving surface 23. An air knife 87 can also be utilized after image transfer to remove the excess solvent on the receiving surface 23.

The master transport assembly 34 stops when the master 48 on the carrier web means 40 is positioned precisely over the conductive receiving surface 23 on the platen 22, so that the master 48 precisely overlies the conductive receiving surface 23. The transfer roller 42 is then lowered into position, so it is ready to perform the transfer operation.

As best seen in FIGS. 2-4, the carrier web means 40, which is mounted to the master transport assembly 34, has an electrically grounded web retention roller means 44 mounted on a retention roller shaft 47. The web tensioning roller means 45, mounted on a shaft 46, can be movably fastened to the master transport assembly 34 to maintain the proper tension on the carrier web means 40 and to keep the carrier web means 40 generally taut. Once properly positioned, the transfer roller 42 is lowered to contact the back or upper side of the carrier web means 40 and traverses a distance equal to at least the length of the master 48 to bring the master adjacent to, but not in contact with, the receiving surface 23 at discrete points along the entire length of the master 48. However, when the master 48 is electrostatically picked up from the platen 22, the carrier web means 40 is brought into contact with the master 48 at discrete points of contact as the vacuum hold down is overcome as described earlier.

Figure 6:
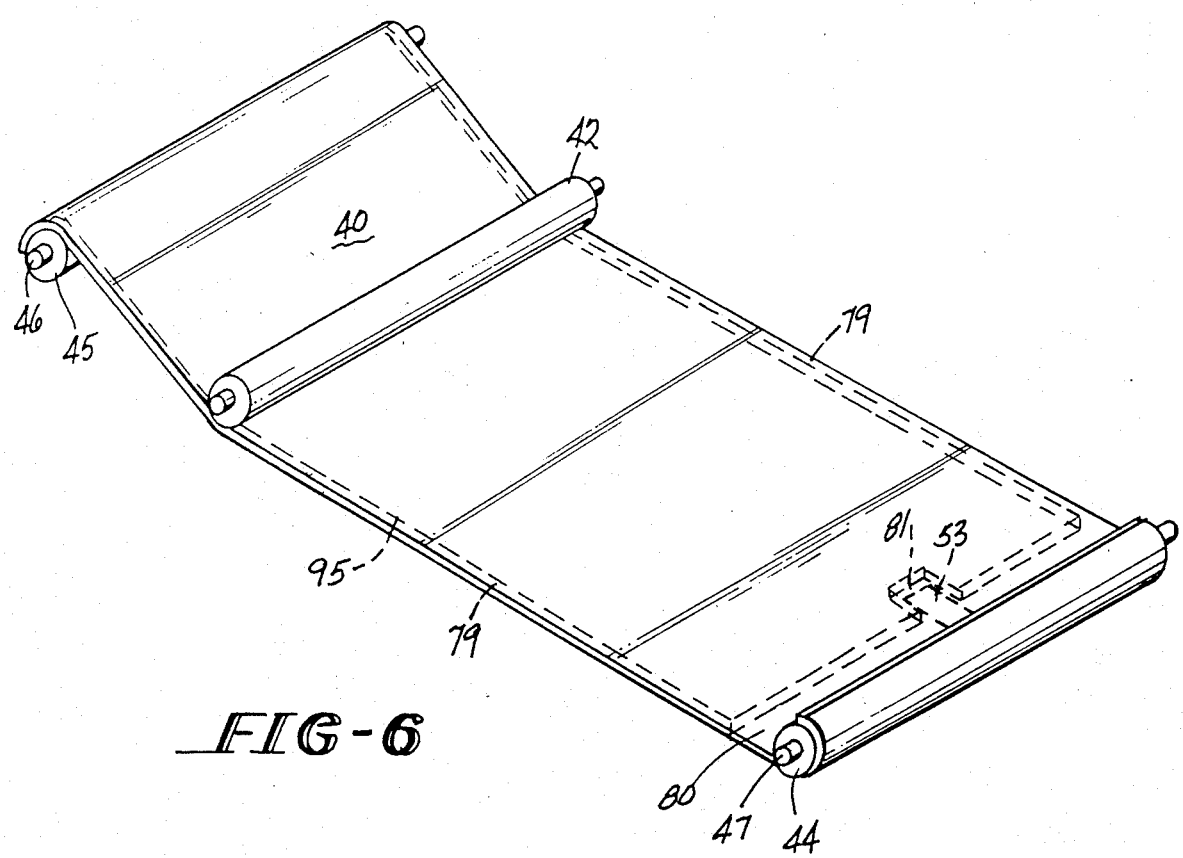
FIG. 6 is a top perspective view showing in dotted lines the positioning of the conductive coating that is applied to the underside of the flexible carrier web on which the master is electrostatically retained.

Web tensioning roller means 45 of FIGS. 2-6 applies the high voltage charge, varying from about 200 to about 3,000 volts, dependent upon the master, to the conductive coating surface 95 of the carrier web means 40 to pick up and retain the master 48 on the carrier web means 40. Web retention roller means 44 is grounded to allow tee background areas on the master to discharge to ground. The carrier web means 40 of FIG. 6 has an etched out border 79 through the conductive coating layer 95 to the dielectric material layer 94, such as the Mylar ® plastic. This border 79 is a nonconductive area that extends from the first edge of the carrier web means 40 across to the opposing second edge of the carrier web means between the conductive tab 53 and the conductive coating layer 95 adjacent the ground area 80. As seen in FIG. 6, the border 79 is recessed around tab 53 in area 81. This border 79 provides a break in the electrical ground plane and the high voltage plane in the area with the conductive coating layer 95. The border 79 also extends laterally along the first edge and the opposing second edge of the carrier web means 40 to isolate the conductive coating layer 95 from ground, effectively preventing the high voltage plane from electrically breaking down along air paths to any grounded apparatus on the master transport assembly 34. Also, where a conductive receiving surface is employed, the border 79 prevents air breakdown from occurring to the receiving surface during the image transfer step. This breakdown of the air can occur due to the voltage across a small gap, for example −1200 volts, holding the master 48 to the carrier web means 40 with negative polarity toner particles in combination with a +1200 volt transfer voltage.

Figure 5A:
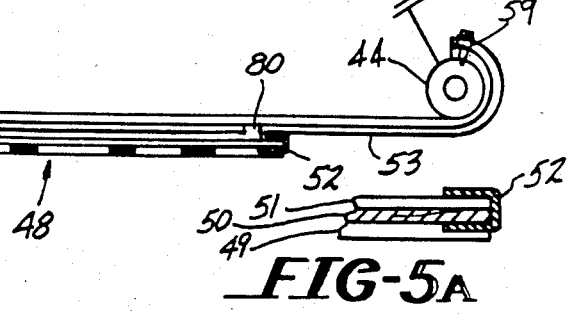
FIG. 5a is an enlarged view of the end of the master showing the flexible ground tab that is made of a conductive material and is attached to the flexible carrier web.

Adjacent the web retention roller means 44 and the border 79 running across between the opposing edges of carrier web means 4 is the dielectric or ground area 80 which prevents the charge in the high voltage area or plane with the conductive coating layer 95 from dissipating. The high voltage area picks up and holds the master 48 on the carrier web means 40 and the ground area 80 provides a path to ground for the unexposed areas of the master to leak their charge via the contact of the conductive tab 53 with the conductive strip 52 on the master 48, as seen in FIGS. 5 and 5A. This conductive strip 52 and the conductive tab 53 permit the conductive layer 50 on the master 48, between the photopolymer layer 49 and the nonconductive substrate layer 51, to go to ground. This permits the master 48 to be developed with charged toner particles by maintaining the charge differential via the inherent resistivity difference once the master 48 is exposed. The conductive strip 52 alternately could be an area of holes punched through the carrier web means 40 and coated with a conductive material, such as silver, on both sides to connect the ground plane of the photopolymer to the ground plane of the carrier web means 40.

Web retention roller means 44 combines with the tensioning roller means 45 and the transfer roller 42 to permit the transfer roller 42 to smooth out the carrier web means 40 and the master 48 to obtain a smooth, continuous surface that is free of ripples.

The transfer roller 42, with the web tensioning roller means 45 and the web retention roller means 44, maintain a uniform tension on the carrier web means 40 to ensure discrete point to point transfer of the developed image on the master to the conductive receiving surface through a transfer window and to avoid entrapping air and excessive non-polar insulating liquid solvent between the two surfaces. The transfer window is the area on the master 48 which the diameter of the transfer roller brings into transfer proximity for discrete point transfer with the conductive receiving surface 23. The finite gap maintained between the master 48 and the receiving surface 23 can be filled with non-polar insulating solvent across which the toner particles travel.

The electrostatic field between the master 48 and the conductive receiving surface 23 is established by the application of a charge on the receiving surface 23. This charge is supplied by an independent high voltage source (not shown) through the aluminum coating on the gap spacing and charging strips 26 of FIG. 1. This electrostatic field permits the transfer of the developed image on the master 48 to the receiving surface 23.

In operation, a master 48 is placed on the platen 22 and registered. The permanent master 48 has previously had its photosensitive surface exposed to obtain the difference in electrical resistivity required for the process by the cross-linking of the exposed surface area to obtain the permanent latent image desired. This cross-linked exposed surface area has increased electrical resistivity.

A dummy receiving surface or punch guide 99 that is the same thickness of the receiving surface 23 is placed on the platen 22. The master 48 is then placed atop this dummy receiving surface 99. The four alignment pins 24 are then raised to register the master 48 and the dummy receiving surface 99 to the platen 22. Once this is properly registered via the pins 24, the vacuum pump apparatus 15 is activated to hold both the dummy receiving surface 99 and the master 48 in place via the perimeter vacuum holes 96.

The master transport assembly 34 positions the carrier web means 40 over the master 48 and the carrier web means 40 is registered to the platen 222 and the master 48, with the use of platen pins 24 and alignment pins 33. An electrical charge is applied to the conductive coating 95 on the surface of the flexible carrier web means 40 via the tensioning roller means 45 to pick up and hold the master 48 in the registered position on the web means 40 as the transfer roller 42 traverses the top of the carrier web means 40, bringing the bottom conductive coating layer 95 into discrete point contact with the master 48 across the length of the master 8. The master transport assembly 34 then returns the carrier web means 40 and the master 48 to the right-most position of FIG. 1 on support frame 11.

The board or conductive receiving surface feed unit 21 then picks up a receiving surface 23 and places it on the platen 22 where it is registered in position via the desired alignment pins 24, 24' and, depending upon the size of the receiving surface 23, pins 24'' or 24'''. Once properly positioned the master transport assembly 34 begins its traverse along guide rails 17 with the master 48, bringing the master 48 over the charge corona 32 to have the master 48 charged. The master 48 and the carrier web means 40 continue traversing to bring the master 48 over the development station 16, with its development electrode 31. The distance between the development electrode 31 and the master 48 is uniformly maintained by the web backing plate (not shown) as the transfer roller means has transfer roller 42 separate from the web backing plate after stop block 57 contacts retractable pin 75. The master transport assembly 34 also continues to transport the master 48 over the reversing roller 30 and depressant corona 29.

The disengagement of the transfer roller 42 from the web backing plate (not shown) allows the web backing plate to be driven in the opposite direction against stop bracket 38. This is accomplished by actuating the retractable stop pin 75, mounted to the support bracket 76, in front of stop block 57 as the master transport assembly 34 is driven towards the platen 22 of FIG. 1 by the main drive screw shaft 35. After the web backing plate abuts stop bracket 38, the retractable stop pin 75 is retracted to a raised position and a rotational clutch is disengaged and permits the toning station 16 to pivot downwardly about a shaft to a lowered position (not shown). The web backing plate is now in the transfer position. The transfer roller 42 is then in position to traverse the carrier web means 40 to effect the electrostatic image transfer from the master 48 to the receiving surface 23.

The receiving surface 23 is wicked by wicking station 19, applying non-polar insulating solvent to it from spray bar 86, as the gap spacing strips 26 are fed out along its opposing edges. A charge is then applied to the receiving surface 23, and the developed image on the permanent master 48 and the receiving surface are then ready for image transfer utilizing the transfer roller 42.

The transfer roller 42 traverses the entire length of the master 48 by being driven along bearing support shafts 37 of FIG. 7 by a transfer roller drive motor (not shown), turning transfer roller drive screw rod 36. Once the transfer roller 42 has traversed this entire length, the transfer roller 42 is suitably connected to carrier backing means or the web backing plate. This positioning continues until the entire master transport assembly 34 is moved back to the start position seen in FIG. 1.

Once the transfer operation has been completed the master cleaning station 18 of FIG. 3 is cammed up to its raised position by the aforementioned cam 84 to permit the master 48 to be cleaned prior to the next image transfer. Cleaning station 18 is then raised against carrier web 40, which is in contact with the web backing plate (not shown). Cleaning station 18 employs a cleaning roller 82 and a spray bar (not shown) to apply a coating of solvent to the master 48 and then remove any excess. A web wiper (not shown) may also be used to clean the master 48 as part of the cleaning station 18 after image transfer has occurred.

The web backing plate (not shown) and the carried transfer roller 42 are held over the cleaning station 18 during the entire cleaning cycle by a drive motor turning an appropriate transfer roller drive screw rod (not shown) towards stop plate 88 of FIG. 1 as master transport assembly 34 is driven at the same speed in the opposite direction to its starting position against a master transport assembly stop plate (not shown). The master 48 is discharged by discharge corona 28 prior to the master transport assembly 34 returning to its starting position. The imaged receiving surface 23 is then removed by pickup apparatus 20 and platen 22 is ready for receipt of another receiving surface 23 from feeder unit 21.

While the preferred structure in which the principles of the present invention have been incorporated is shown and described above, it is to be understood that the invention is not to be limited to the particular details thus presented but, in fact, widely different means may be employed in the practice of the broader aspects of this invention. For example, the method of retaining the master to a flexible substrate could also be used to register a master to a non-flexible substrate, such as a drum or a flat plate. The photopolymer material used as the master with the permanent latent image could be included in the carrier web means. The registration method and apparatus is equally well employable with conductive or nonconductive receiving surfaces.

Additionally, to effect transfer the electric field established between the master and the receiving surface can be charged with either positive or negative polarity, depending upon the charge of the toner particles, to direct the charged toner particles across the gap to the receiving surface. Charged toner particles of negative polarity will be attracted to a positively charged conductive receiving surface or will be repelled by a negative background charging of the electrostatically imageable surface. If charged toner particles of positive polarity are used, they will be attracted to a negatively charged conductive receiving surface or repelled by a positive background charging of the electrostatically imageable surface. It has also been found that charging the conductive coating on the flexible carrier means with the same polarity or charge as the toner particles carry repels the toner particles from the conductive coating, as seen in FIG. 10. This prevents the buildup of toner particles from occurring.

Similarly, in the development of the master, alternate methods can be used. Negatively charged toner particles will be attracted to a positively charged latent image or vice versa. In the instance of reversal development where the background areas are exposed, the desired image areas on the master will be uncharged and the surrounding non-image areas will be charged the same as the toner particles to cause the charged toner particles to be repelled from the non-image areas onto the desired image area.

The scope of the appended claims is intended to encompass all obvious changes in the details, materials and arrangements of parts that will occur to one of ordinary skill in the art upon a reading of this disclosure.

What is claimed is:

1. Apparatus for the electrostatic pickup and retention of an exposed master with a periphery, the master having a permanent latent image thereon used in the transfer of toner developed images to a receiving surface comprising in combination:
(a) a supporting frame;
(b) an elongate planar flexible carrier means having a first end, an opposing second end, a first surface and an opposing second surface defined by the first end the opposing second end and a first edge and an opposing second edge, the second surface being at least partially coated with a conductive material;
(c) retention means connected to the supporting frame and having the first end of the flexible carrier means fastened thereto;
(d) tensioning means connected to the supporting frame and having the second end of the flexible carrier mean fastened thereto, the tensioning means in cooperation with the retention means stretching the flexible carrier means generally taut therebetween;
(e) transfer assembly means movable between a first position and a second position on the supporting frame, the flexible carrier means being attached to and movable with the transfer assembly means to position the flexible carrier means over a master pickup location in the first position;
(f) support means connected to the supporting frame to support the master at a master pickup location; and
(g) transfer roller means movably connected to the transfer assembly means and contactable with the first surface of the flexible carrier means to bring the carrier means into discrete point contact as the transfer roller means traverses the first surface to thereby electrostatically pickup the master from the support means and retain it on the second surface where the conductive material has been coated.

2. The apparatus according to claim 1 wherein the flexible carrier means further comprises an electrically nonconductive web.

3. The apparatus according to claim 2 wherein the flexible carrier web further includes a conductive tab adjacent the retention means to electrically conduct electrical current to ground.

4. The apparatus according to claim 3 wherein the flexible carrier web further comprises an electrically nonconductive border between the conductive tab and the conductive material on the opposing second surface extending from the first edge across the flexible carrier web to the opposing second edge to provide a break in the electrical ground plane from the high voltage plane.

5. The apparatus according to claim 4 wherein the flexible carrier web further comprises the nonconductive border extending laterally along the first edge and the second edge connecting the nonconductive border between the conductive tab and the conductive material to thereby isolate the conductive surface from ground.

6. The apparatus according to claim 4 wherein the supporting means is a generally hollow platen with a plurality of holes connecting a top supporting surface and a hollow interior, the hollow interior further being connected to vacuum means to create a vacuum therein to retain the master on the top supporting surface.

7. The apparatus according to claim 6 wherein the plurality of connecting holes in the generally hollow platen correspond generally to the periphery of the master, defining a shape smaller than the periphery of the master.

8. The apparatus according to claim 1 wherein the flexible carrier web is fastened to the retention means and the tensioning means by clamping means.

9. The apparatus according to claim 8 wherein the retention means is a roller with a groove thereacross, the groove receiving the clamping means and the flexible web therein.

10. The apparatus according to claim 9 wherein the tensioning means is a roller with a groove thereacross, the groove receiving the clamping means and the flexible web therein.

11. The apparatus according to claim 7 wherein the platen further includes registration means to register the master to the platen and retain the master in place.

12. The apparatus according to claim 11 wherein the transfer assembly further includes alignment means to align and register the transfer assembly and the attached flexible carrier means to the platen.

13. The apparatus according to claim 5 wherein the retention means is connected to electrical ground.

14. The apparatus according to claim 13 wherein the tensioning means is connected to a source of voltage.

15. An elongate flexible carrier web tensioned generally tautly between a first retention means and a second tensioning means, the flexible carrier means being adapted to electrostatically pickup and retain a master having a permanent latent image thereon, comprising in combination:
(a) an elongate carrier substrate having a first surface and an opposing second surface connected on a first end to the tensioning means and on an opposing second end to the retention means, the elongate carrier substrate having the first end and the opposing second end connected by a first edge and an opposing second edge, the elongate carrier substrate further being formed from an electrically nonconductive material;
(b) conductive material coating a portion of the second surface of the elongate carrier substrate forming a pattern whereby a non-coated border extends laterally from the first end to the second end along the first edge and the opposing second edge and adjacent the retention means between the first edge and the opposing second edge; and
(c) electrically conductive means connected to the elongate carrier substrate adjacent the retention means intermediate the first edge and the opposing second edge extending from the retention means a short distance toward the tensioning means offsetting the non-coated border between the first edge and the opposing second edge thereabout it to maintain the non-coated border between the conductive material and the electrically conductive means.

16. The apparatus according to claim 15 wherein the retention means is electrically grounded.

17. The apparatus according to claim 16 wherein the tensioning means is connected to an electrical power source.

18. The apparatus according to claim 17 wherein the flexible carrier web electrostatically picks up and retains the master on the second surface when electrical power is supplied to the tensioning means and the second surface is brought into contact with the master.

19. The apparatus according to claim 18 wherein the master retained on the second surface comprises a first electrically nonconductive substrate which contacts the second surface, an electrically conductive layer attached to the first nonconductive substrate and an exposed photopolymer layer attached to the electrically conductive layer and having a permanent latent image therein.

20. The apparatus according to claim 19 wherein the electrically conductive means connected to the elongate carrier substrate provides a conductive path to electrical ground between the photopolymer layer of the master, the first nonconductive substrate and the conductive material coating the second surface of the elongate carrier across the non-coated border between the first edge and the opposing second edge.

21. The apparatus according to claim 20 wherein the master has an electrically conductive strip along the one of the two opposing edges adjacent the electrically conductive means connected to the elongate carrier substrate between the photopolymer layer and the electrically conductive layer, the conductive strip wrapping about at least a portion of the one of the two opposing edges and inserting between the electrically conductive layer and the first electrically nonconductive substrate, the electrically conductive strip being contactable with the electrically conductive means connected to the elongate carrier substrate to provide a ground contact path.

22. The apparatus according to claim 21 wherein the elongate carrier substrate is formed from a dielectric material selected from the group consisting of polyethylene terephthalate, polyimide, polyvinyl fluoride, polyvinylidene fluoride and polycarbonate.

23. The apparatus according to claim 21 wherein the conductive material coating a portion of the second surface of the elongate carrier substrate is selected from the group consisting of aluminum, copper or silver.

24. The apparatus according to claim 23 wherein the electrically conductive means connected to the elongate carrier substrate is thin flexible metallic material.

25. The apparatus according to claim 24 wherein the metallic material is selected from the group consisting of copper, aluminum, and silver.

26. The apparatus according to claim 24 wherein the first electrically nonconductive substrate of the master is formed from a material selected from the group consisting of polyethylene terephthalate, polyimide, polyvinyl fluoride, polyvinylidene fluoride and polycarbonate.

27. The apparatus according to claim 24 wherein the electrically conductive layer of the master is formed from a material selected from the group consisting of aluminum, copper and silver.

28. The apparatus according to claim 24 wherein the photopolymer layer is a photoresist.

29. A method of electrostatically picking up and retaining an exposed master having a permanent latent image in a photopolymer layer on a carrier means comprising the steps of:
   (a) tensioning the carrier means between a tensioning means and a retention means;
   (b) applying a voltage to the carrier means to form a high voltage plane on the carrier means;
   (c) providing a break between the high voltage plane and a ground plane;
   (d) positioning the carrier means adjacent the exposed master;
   (e) contacting transfer means to one surface of the carrier means at discrete points of contact thereby moving the carrier means at the discrete points of contact into contact with the master on the opposing surface of the carrier means by the transfer means traversing the one surface of the carrier means to thereby effect the electrostatic picking up and retaining of the master to the carrier means at those discrete points of contact; and
   (f) contacting an electrically conductive strip along one edge of the master to electrically conductive means connected to the carrier means at the ground plane.

30. The method according to claim 29 further comprising using a roller movably fastened to a supporting frame as the tensioning means.

31. The method according to claim 30 further comprising using a roller fastened to the supporting frame as the retention means.

32. The method according to claim 31 further comprising using a roller as the transfer means to rolling traverse the one surface of the carrier means.

33. The method according to claim 32 further comprising using a flexible web of plastic material as the carrier means, the flexible web being at least partially coated with a conductive material on the opposing surface.

34. The method according to claim 33 further comprising holding the master in place on a supporting platen prior to contacting the master at discrete points with the flexible web.

35. The method according to claim 34 further comprising using a vacuum to hold the master in place on the supporting platen.

36. The method according to claim 35 further comprising developing the permanent latent image by charging the master with a first charge and applying toner particles with an opposite charge thereto.

37. The method according to claim 36 further comprising charging the conductive material on the opposing surface of the flexible web with the same charge polarity as the charge of the toner particles to repel the toner particles from the conductive material.

38. The method according to claim 37 further comprising detaching the master from the flexible web by terminating the voltage to the flexible web.

39. The method according to claim 29 further comprising the transfer means continuously contacting the one surface of the carrier means to traverse a distance a least equal to the length of the master.

40. The method according to claim 35 further comprising developing the permanent latent image by charging the master with a first charge and applying toner particles with the same charge thereto.

41. The method according to claim 40 further comprising charging the conductive material on the opposing surface of the flexible web with the same charge polarity as the charge of the toner particles to repel the toner particles from the conductive material.

* * * * *